United States Patent [19]

Erbele

[11] Patent Number: 5,012,390
[45] Date of Patent: Apr. 30, 1991

[54] MOUNTING AND CONNECTION SYSTEM FOR ELECTRICAL COMMUNICATIONS EQUIPMENT

[75] Inventor: Kurt Erbele, Weissach im Tal, Fed. Rep. of Germany

[73] Assignee: ANT Nachrichtentechnik GmbH, Backnang, Fed. Rep. of Germany

[21] Appl. No.: 295,131

[22] Filed: Jan. 9, 1989

[30] Foreign Application Priority Data

Jan. 15, 1988 [DE] Fed. Rep. of Germany ....... 3800978

[51] Int. Cl.$^5$ .............................................. H05K 1/14
[52] U.S. Cl. .................................... 361/413; 361/407; 361/409
[58] Field of Search ............... 361/400, 406, 407, 408, 361/409, 410, 412, 413; 439/61; 307/36, 42

[56] References Cited

U.S. PATENT DOCUMENTS

3,833,838  8/1974  Christiansen .................. 361/406 X
4,420,793 12/1983  Strandberg .
4,697,858 10/1987  Balakrishnan .......................... 439/61
4,811,165  3/1989  Currier et al. ........................ 361/413

FOREIGN PATENT DOCUMENTS

2078015 12/1981  United Kingdom ................ 361/413

Primary Examiner—Leo P. Picard
Assistant Examiner—Paramita Ghosh
Attorney, Agent, or Firm—Spencer and Frank

[57] ABSTRACT

A mounting and connection system for electrical communications equipment of the type including a plurality of plug-in modules which are each provided with electrical components and with multi-pin connectors, and which are inserted from the front into a magazine whose rear face is provided with a rear wall circuit board. This circuit board, in turn, is provided with multi-socket connectors into which the pin connectors engage. For signals which are to be supplied to all plug-in modules, bus bars are provided with such a bus bar being composed of a plurality of bus bar sections, each formed of a conductor path on the rear wall circuit board and each connecting only one contact socket of two adjacent socket connectors. The associated two connector pins of each pin connector are conductively connected with one another by a first conductor which leads from a first of the two connector pins to a terminal pin of an electrical component and a second conductor which leads from this terminal pin to the second one of the two connector pins, whereby stub lines, and thus reflection points, in the conductive connection are avoided.

3 Claims, 1 Drawing Sheet

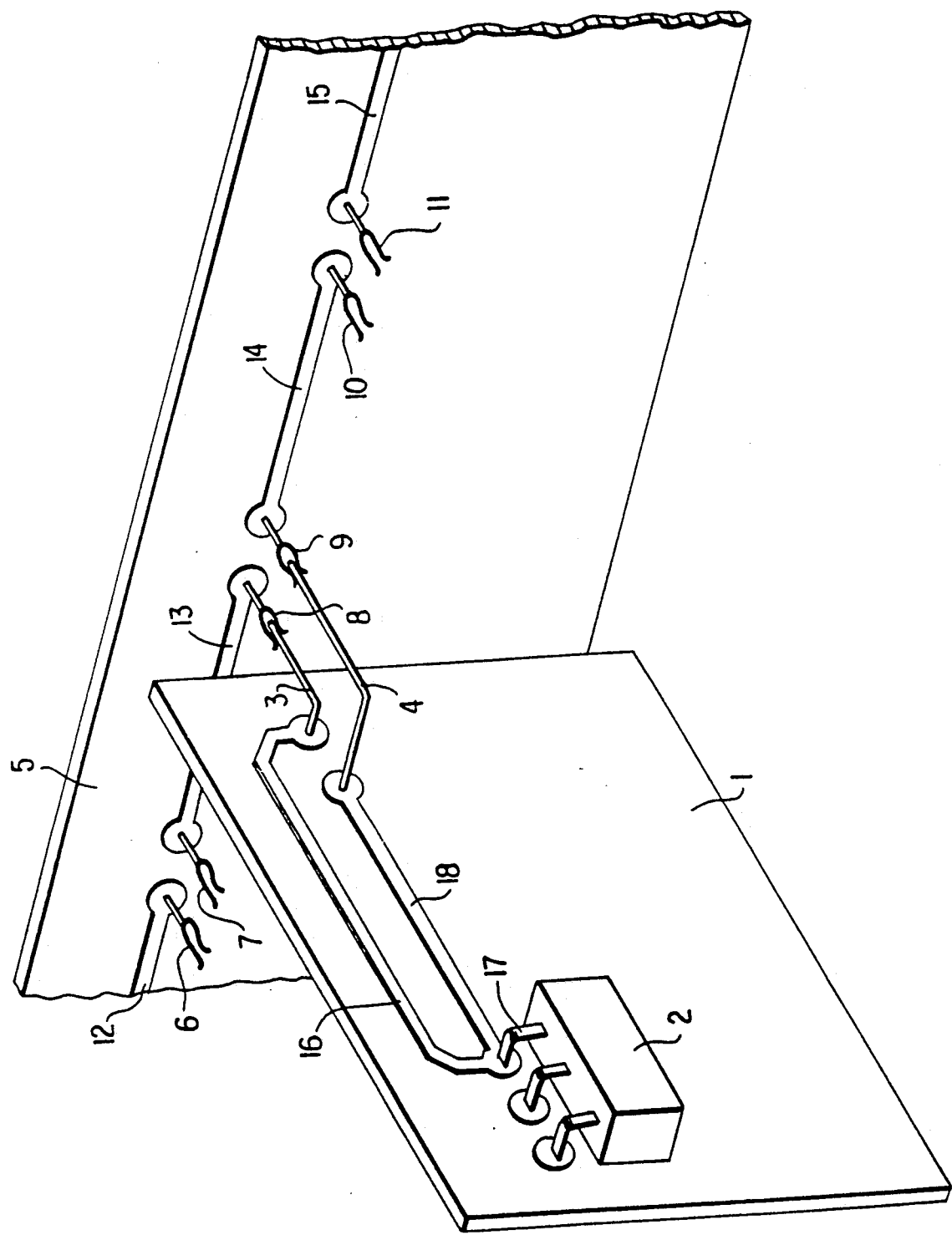

MOUNTING AND CONNECTION SYSTEM FOR ELECTRICAL COMMUNICATIONS EQUIPMENT

BACKGROUND OF THE INVENTION

The present invention relates to a mounting and connection system for electrical communications equipment of the type which includes: a plurality of the plug-in modules each provided with electrical components and with muti-pin connectors; a magazine which accomodates the plug-in modules and is provided with a rear wall circuit board provided with socket connectors mating with the multi-pin connectors; a plurality of bus bar sections provided on the rear wall circuit board, with each bus bar section connecting only one contact element of a socket connector with only one contact element of an adjacent socket connector; and a conductive connection between the two contact elements of each multi-pin connector engaging in the contact elements of the socket connectors at the ends of the bus bar sections.

Such a system is disclosed in Federal Republic of Germany published application DE-OS 3,137,388, corresponding to U.S. Pat. No. 4,420,793. The system is composed of a plurality of plug-in components or modules which each carry electrical components and which are provided with respective pin connector strips along one edge. A plurality of plug-in components are inserted from the front into a magazine at whose rear a rear wall circuit board is provided This rear wall circuit board is provided with socket connector strips into which the pin connector strips engage. The socket strips are electrically connected with one another by means of conductors on the rear wall circuit board. For signals which are to be fed to all or a plurality of plug-in modules, bus bars, composed of bus bar sections, are provided. Each bus bar section is formed of a conductor on the rear wall circuit board and connects only one socket contact of each of two adjacent socket connector strips. The associated two pins on the respective pin connector strips are directly conductively connected with one another on the respective plug-in component to form a bridge connection between two adjacent bus bar sections. Thus, a bus bar exists only if the required number of plug-in modules has been inserted.

On the respective plug-in modules, a conductor branches off from the direct connection between the two pins and leads to the electrical component on the plug-in module which is to be supplied with the respective signal. For a high-frequency signal such a branch point signifies an undesirable reflection point.

SUMMARY OF THE INVENTION

It is an object of the present invention to provide a system of the above described type which avoids such an undesirable reflection point.

The above object is achieved according the present invention by a mounting and connection system for electrical communications equipment which comprises: a plurality of the plug-in modules, each provided with electrical components and with at least one pin connector having a plurality of contact pins for providing connections to the components; a circuit board which is provided with a plurality of adjacent socket connectors, each including a plurality of socket contacts, matingly engaging a respective pin connector of a respective plug-in module; a plurality of bus bar conductor sections disposed o the circuit board and extending between adjacent ones of the socket connectors, with each bus bar conductor section connecting only one socket contact of a respective one of the socket connectors with only one socket contact of an adjacent socket connector; and a respective conductive connection between the respective two of the contact pins of each of the pin connectors which engage in the two contact sockets of the associated socket connector which are connected to the respective associated ones of the bus bar conductor sections; and wherein each of the connective connections includes a first conductor extending from a first of the two contact pins of the respective pin connector to a terminal pin of an electrical component of the respective plug-in module, and a second conductor extending from the terminal pin to a second of the two contact pins of the respective pin connector.

The invention will be described below in greater detail with reference to one embodiment.

BRIEF DESCRIPTION OF THE DRAWING

The FIGURE is a schematic illustration of an arrangement according to the present invention.

DETAILED DESCRIPTION OF THE PREFERRED EMBODIMENT

In the FIGURE, only one plug-in module or component 1, of the many plug-in components that are accommodated next to one another in a magazine (not shown), is illustrated. Each of the plug-in modules 1 is provided with a plurality of electrical components 2 of which only one, e.g., an integrated circuit, is shown. The plug-in modules 1, which as shown basically comprise a printed circuit board with its components, are further provided with multi-pole plug-in connectors which extend along the edge of the respective module or circuit board and which are generally configured as vertically extending columns of contact or connector pin strips. Only two contact elements, i.e. connector or contact pins 3 and 4, of the connector of the illustrated plug-in module 1 are shown. Also not shown are the insulated components in which these connector pins, are embedded in a conventional connector.

On or adjacent the rear wall of the magazine (not shown), there is provided a rear wall circuit board 5. This circuit board 5 is provided with mating connectors, i.e. in the form of socket connectors with socket contacts in the illustrated embodiment, to match the multi-pole connector for each respective plug-in module. Only two contact elements, i.e. contact sockets 6 and 7, 8 and 9, and 10 and 11, of each of three adjacent socket connectors on circuit board 5 are shown. Additionally, not shown are the insulated bodies in which these contact sockets 6-11 are embedded in a conventional connector.

Rear wall circuit board 5, of which only a part is shown, is provided with bus bar sections in the form of printed conductors. Bus bar sections 13 and 14 are shown in their entirety, while bus bar sections 12 and 15 are shown only in part. Bus bar section 14 connects only the contact element or socket 9 of one socket connector with the contact element or socket 10 of the adjacent socket connector for a further plug-in module 1. In a similar manner bus bar section 13 connects only contact element 9 with the contact element 7 of the other adjacent socket connector. Generally speaking, each bus bar section connects together one contact element of each of two adjacent socket connectors. It is understood that the rear wall circuit board 5 is provided with further conductors (not shown) which connect the non-illustrated contact elements of the respective socket connectors with one another.

Connector pins 3 and 4 of the illustrated plug-in module 1 are plugged into and engage contact sockets 8 and 9, respectively. According to the invention, a first conductor 16 leads from contact pin 3 to a terminal pin 17 of the integrated circuit component 2, and a second conductor 18 leads from this terminal pin 17 to contact pin 4. The non-illustrated plug-in modules whose pairs of connector pins corresponding to pins 3 and 4 engage in sockets 6, 7 and 10, 11, respectively, and into further non-illustrated sockets pairs for the bus bar, are configured in the same manner.

With the described arrangement, a complete bus bar is created only if all plug-in modules 1 for a bus bar are plugged into the circuit board 5. The bus bar is composed of bus bar sections (e.g., 12–15), contact sockets (e.g., 6–11), contact pins (e.g., pins 3 and 4 and the corresponding pairs of pins for the socket pairs 6, 7 and 10, 11) and the first conductor 16 and the second conductor 18 on each respective module 1. Due to the respective line pairs 16, 18, such a bus bar has no stub lines whose length must be considered with respect to the wavelength of a high-frequency signal to be transmitted over the bus bar. Thus, there are also no reflection points created by such stub lines and their disadvantageous effects, such as, for example, reflections. Although terminal pin 17 and its extension within the integrated circuit 2 do form a stub line, its length is negligibly short.

The present invention thus makes it possible to arrange electrical components at any desired locations on a plug-in module and to supply them with a high-frequency signal via a bus bar.

In the illustrated embodiment, only a single-pole bus bar is described. However, it is to be understood that multi-pole bus bars can be set up in the same manner. Moreover, a plurality of such single or multiple pole bus bars may be provided in the same system.

The invention now being fully described, it will be apparent to one of ordinary skill in the art that many changes and modifications can be made thereto without departing from the spirit or scope of the invention as set forth herein.

The present disclosure relates to the subject matter disclosed in Federal Republic of Germany patent Application P 38 00 978.1 of Jan. 15th, 1988, the entire specification of which is incorporated herein by reference.

What is claimed is:

1. In a mounting and connection system for electrical communications equipment comprising: a plurality of plug-in modules, each provided with electrical components and with at least one pin connector having a plurality of contact pins for providing connections to said components; a circuit board which is provided with a plurality of adjacent socket connectors, each including a plurality of socket contacts, matingly engaging a respective said pin connector of a respective said plug-in modules; a plurality of bus bar conductor sections disposed on said circuit board and extending between adjacent ones of said socket connectors, with each said bus bar conductor section connecting only one socket contact of a respective one of said socket connectors with only one said socket contact of an adjacent said socket connector; and a respective conductive connection between the respective two of said contact pins of each of said pin connectors which engage in the two contact sockets of the associated said socket connector which are connected to the respective associated ones of said bus bar conductor sections; the improvement wherein each of said conductive connections includes a first conductor extending from a first of said two contact pins of the respective said pin connector to a terminal pin of an electrical component of the respective plug-in module, and a second conductor extending from said terminal pin to a second of said two contact pins of the respective said pin connector.

2. A system as defined in claim 1 wherein each of said plug in modules includes a respective circuit board having its respective said connector disposed along one edge.

3. A system as defined in claim 2 wherein each of said first and second conductors are disposed on the respective said circuit board of the respective plug-in module.

* * * * *